United States Patent
Smith et al.

(10) Patent No.: US 10,453,850 B2
(45) Date of Patent: Oct. 22, 2019

(54) THREE-DIMENSIONAL SEMICONDUCTOR DEVICE INCLUDING INTEGRATED CIRCUIT, TRANSISTORS AND TRANSISTOR COMPONENTS AND METHOD OF FABRICATION

(71) Applicant: TOKYO ELECTRON LIMITED, Minato-ku (JP)

(72) Inventors: Jeffrey Smith, Clifton Park, NY (US); Anton deVilliers, Clifton Park, NY (US)

(73) Assignee: Tokyo Electron Limited, Minato-ku (JP)

( * ) Notice: Subject to any disclaimer, the term of this patent is extended or adjusted under 35 U.S.C. 154(b) by 0 days.

(21) Appl. No.: 15/654,327

(22) Filed: Jul. 19, 2017

(65) Prior Publication Data

US 2018/0026042 A1   Jan. 25, 2018

Related U.S. Application Data

(60) Provisional application No. 62/363,973, filed on Jul. 19, 2016, provisional application No. 62/372,106, (Continued)

(51) Int. Cl.
  *H01L 21/8238*   (2006.01)
  *H01L 27/092*    (2006.01)
  (Continued)

(52) U.S. Cl.
  CPC .. *H01L 27/1104* (2013.01); *H01L 21/823821* (2013.01); *H01L 27/0688* (2013.01);
  (Continued)

(58) Field of Classification Search
  CPC .. H01L 27/0688; H01L 27/11; H01L 27/1108; H01L 27/1104; H01L 29/42392;
  (Continued)

(56) References Cited

U.S. PATENT DOCUMENTS 5,631,863 A    5/1997   Fechner et al.
8,338,292 B2   12/2012  Tan et al.
(Continued)

OTHER PUBLICATIONS

International Search Report and Written Opinion of the International Searching Authority dated Nov. 16, 2017 in PCT/US2017/042802 filed Jul. 19, 2017.
(Continued)

*Primary Examiner* — Nelson Garces
(74) *Attorney, Agent, or Firm* — Oblon, McClelland, Maier & Neustadt, L.L.P.

(57) ABSTRACT

A 3-D IC includes a substrate having a substrate surface. A first semiconductor device has a first electrical contact and is formed in a first area of the surface on a first plane substantially parallel to the substrate surface. A second semiconductor device has a second electrical contact and is formed in a second area of the surface on a second plane substantially parallel to the surface and vertically spaced from the first plane in a direction substantially perpendicular to the surface. A first electrode structure includes opposing top and bottom surfaces substantially parallel to the substrate surface, and a sidewall connecting the top and bottom surfaces such that the electrode structure forms a three dimensional electrode space. A conductive fill material is provided in the electrode space, and a dielectric layer electrically separates the conductive fill material into a first electrode electrically connected to the first contact of the first semiconductor device and a second electrode electrically connected to the second semiconductor device and electrically insulated from the first electrode. A first circuit terminal extends vertically from the top or bottom surface of the electrode structure and is electrically connected to the first electrode.

18 Claims, 12 Drawing Sheets

Related U.S. Application Data filed on Aug. 8, 2016, provisional application No. 62/373,164, filed on Aug. 10, 2016.

(51) Int. Cl.
*H01L 27/06* (2006.01)
*H01L 27/11* (2006.01)
*H01L 29/423* (2006.01)

(52) U.S. Cl.
CPC ............ *H01L 27/092* (2013.01); *H01L 27/11* (2013.01); *H01L 29/42392* (2013.01); *H01L 21/823807* (2013.01); *H01L 27/1108* (2013.01)

(58) Field of Classification Search
CPC ....... H01L 2924/1437; H01L 29/78687; H01L 29/78696; H01L 2029/7858; H01L 29/0669–0673; H01L 21/823821; H01L 27/0924; H01L 29/7851; H01L 29/7853–7854; H01L 27/1025; H01L 27/088; H01L 27/10; H01L 27/112; H01L 27/122; H01L 2027/11816; H01L 29/122–127; H01L 27/11551–11556; G11C 11/411–4125; G11C 11/14; G11C 11/34

See application file for complete search history.

(56) References Cited

U.S. PATENT DOCUMENTS

| | | |
|---|---|---|
| 8,753,942 B2 | 6/2014 | Kuhn et al. |
| 2006/0028861 A1* | 2/2006 | Han .................. G11C 11/412 365/154 |
| 2006/0175638 A1 | 8/2006 | Ohki |
| 2006/0237857 A1 | 10/2006 | Bertin et al. |
| 2007/0268739 A1 | 11/2007 | Yoo et al. |
| 2012/0007052 A1 | 1/2012 | Hobbs et al. |
| 2013/0161756 A1 | 6/2013 | Glass et al. |
| 2013/0270512 A1 | 10/2013 | Radosavljevic et al. |
| 2014/0197377 A1 | 7/2014 | Kim et al. |
| 2014/0312426 A1 | 10/2014 | Balakrishnan et al. |
| 2015/0228652 A1 | 8/2015 | Cheng et al. |
| 2016/0211264 A1* | 7/2016 | Peng .................. H01L 21/8221 |
| 2017/0040321 A1 | 2/2017 | Mitard |
| 2017/0178971 A1 | 6/2017 | Merckling et al. |
| 2017/0221884 A1* | 8/2017 | Machkaoutsan ............................ H01L 21/823487 |

OTHER PUBLICATIONS

International Search Report & Written Opinion dated Oct. 25, 2017 in International Application No. PCT/US2017/045864, filed Aug. 8, 2017 [citing documents AA-AD therein] 7 pp.

* cited by examiner

THREE-DIMENSIONAL SEMICONDUCTOR DEVICE INCLUDING INTEGRATED CIRCUIT, TRANSISTORS AND TRANSISTOR COMPONENTS AND METHOD OF FABRICATION

CROSS REFERENCE TO RELATED APPLICATIONS

This application is based on, and claims the benefit of priority to, U.S. provisional application No. 62/363,973 filed on Jul. 19, 2016, and to U.S. provisional application No. 62/372,106 filed Aug. 8, 2016, and to U.S. provisional application No. 62/373,164 filed on Aug. 10, 2016. The entire contents of each of these applications are incorporated herein by reference.

BACKGROUND

Field of the Disclosure

The present invention relates to a semiconductor device and a method of manufacturing a semiconductor device such as an integrated circuit, and to manufacturing transistors and transistor components for an integrated circuit.

Description of Related Art

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Accordingly, one object of the present disclosure is to facilitate manufacturing of 3D semiconductor circuits.

This and other objects of the disclosure may be provided by a three dimensional (3-D) integrated circuit (IC) including a substrate having a substrate surface. A first semiconductor device having a first electrical contact and is formed in a first area of the surface on a first plane substantially parallel to the substrate surface semiconductor device. A second semiconductor device including a second electrical contact is formed in a second area of the surface on a second plane substantially parallel to the surface and vertically spaced from the first plane in a direction substantially perpendicular to the substrate surface. A first electrode structure includes opposing top and bottom surfaces substantially parallel to the substrate surface, a sidewall connecting the top and bottom surfaces such that the electrode structure forms a three dimensional electrode space. A conductive fill material is provided in the electrode space, and a dielectric layer electrically separates the conductive fill material into a first electrode electrically connected to the first contact of the first semiconductor device and a second electrode electrically connected to the second semiconductor device and electrically insulated from the first electrode. A first circuit terminal extends vertically from the top or bottom surface of the electrode structure and being electrically connected to the first electrode.

According to another aspect, a semiconductor device includes a substrate, a gate formed on the substrate, a source-drain region that includes vertically stacked nanowires separated from each other, and a step-shaped contact structure formed within the source-drain region that electrically connects each nanowire to positions above the source-drain region. This aspect may provide a benefit that each nanowire in the vertical stack can be independently connected upward in the device.

According to another aspect, a semiconductor device includes a source-drain region that includes vertically stacked nanowires separated vertically from each other such that there are at least two nanowires in a given stack. a step-shaped contact structure is formed within the source-drain region that electrically connects each nanowire to positions above the source-drain region, the step-shaped contact structure including vertically overlapping electrodes.

According to another aspect, a semiconductor device includes a first layer of nanowires, a second layer of nanowires positioned above the first layer of nanowires; and a third layer of nanowires positioned above the second layer of nanowires. The first layer of nanowires, the second layer of nanowires, and the third layer of nanowires are all positioned within a source-drain region of a semiconductor device. A step-shaped contact structure positioned within the source-drain region and configured to electrically couple each layer of nanowires to a position above the source-drain region. The structure enables having an nfet directly over a pfet or the vice versa According to another aspect, a semiconductor device includes a first layer of nanowires, a second layer of nanowires positioned above the first layer of nanowires, and a third layer of nanowires positioned above the second layer of nanowires. The first layer of nanowires, the second layer of nanowires, and the third layer of nanowires include nanowire portions positioned within a source-drain region of a semiconductor device. a first electrode that connects the first layer of nanowires and is routed through the source-drain region to a first position above the source-drain region, a second electrode that connects the second layer of nanowires and is routed through the source-drain region to a second position above the source-drain region, and a third electrode that connects the third layer of nanowires and is routed through the source-drain region to a third position above the source-drain region. The first contact structure is step-shaped with a portion of the second contact structure positioned above a horizontal surface of the underlying electrode structure.

Still another aspect of the disclosure includes a method of forming a semiconductor device, the method including forming a source-drain region having a vertical stack of nanowires that includes at least three nanowires with longitudinal axes oriented horizontally and with the nanowires being spaced apart from each other, a process sequence is executed including of depositing metal in the source-drain region, recessing metal to a particular nanowire level, forming vertical interconnects within the source-drain region, and selectively depositing barrier material on metal without depositing barrier material on uncovered nanowires such that a contact structure is formed within the source-drain region to a point above the source-drain region. the process sequence is repeated until forming multiple electrodes having step-shaped cross-sections and horizontal steps that support other electrodes.

Still another aspect includes a method of forming a semiconductor device, the method including providing a substrate defining an initial connection area, the substrate having at least three nanowires positioned within the initial connection area, the nanowires being uncovered, the nanowires having a longitudinal axis that extends in a horizontal direction, the nanowires being positioned in a vertical stack and spaced apart from each other, the nanowires including a first nanowire, a second nanowire, and a third nanowire, the second nanowire being positioned above the first nanowire, and the third nanowire being positioned above the second nanowire. A first electrode is formed that that covers the first nanowire and extends vertically to a top of the initial connection area, the first electrode having a step-shaped cross-section, a second electrode is formed that covers the second nanowire and extends vertically to a top of the initial connection area, and a third electrode is formed that covers the third nanowire and extends vertically to a top of the initial connection area.

Still another aspect is a method of forming a semiconductor device, including filling a connection region with a first electrode, the connection region having vertically aligned nanowires separated vertically from each other such that there are at least three nanowires in a given stack of nanowires, recessing the metal until the first electrode covers only a first nanowire, the first nanowire positioned at a bottom of the given stack, and forming a vertical line of the first electrode that connects to recessed metal such that a combined electrode structure has a step-shaped cross-section. a barrier layer is formed on uncovered metal surfaces without depositing the barrier layer on uncovered nanowire surfaces.

Still another aspect includes A method of forming a semiconductor device, including forming a field effect transistor that includes vertically-stacked complementary nanowires having at least two levels of nanowires, and that has a step-shaped contact structure that connects to the nanowires. Electrodes of the step-shaped contact structure are formed by uniformly recessing deposited metal to form a horizontal metal surface, using a mask-based deposition of metal to form a vertically-oriented metal leg that connects to the horizontal metal surface, and forming a dielectric barrier layer on uncovered metal surfaces by selective deposition that selectively deposits the dielectric barrier layer on the uncovered metal surfaces without depositing the dielectric barrier layer on nanowire material.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

DETAILED DESCRIPTION

Figure 1:
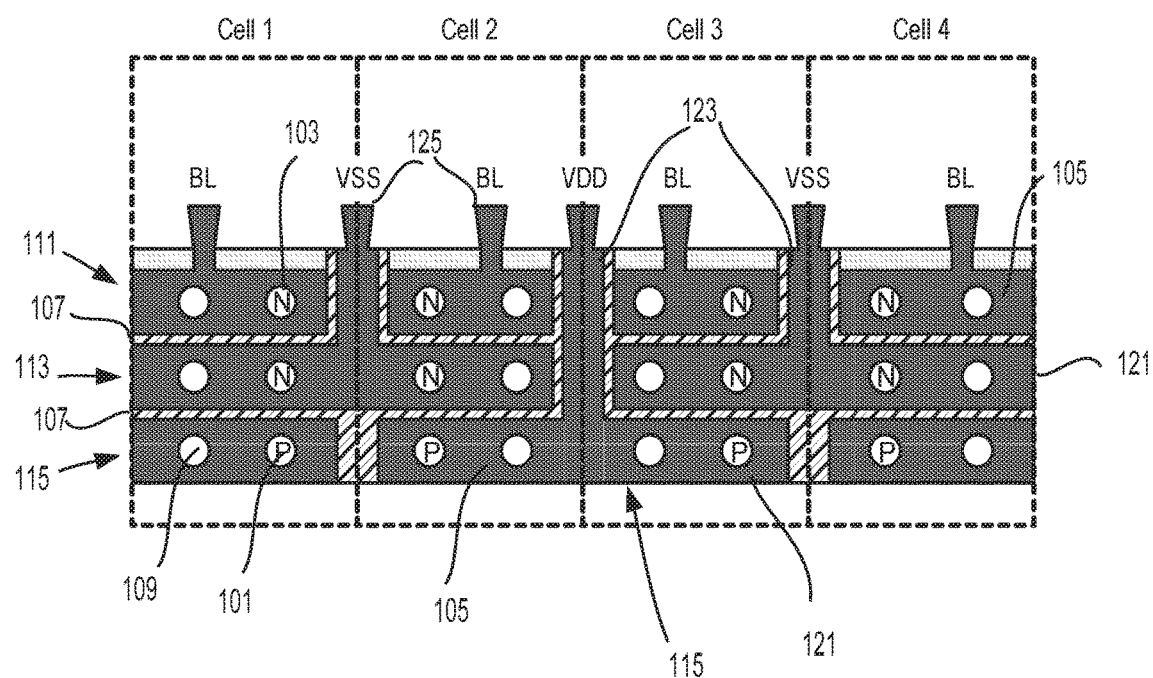
FIG. 1 is a schematic illustration of a cross-section of a stacked complementary FET device according to embodiments of the disclosure.

Techniques herein pertain to fabrication of 3D integrated circuits in which circuit devices are vertically arranged in relation to a planar surface of a substrate. According to disclosed embodiments, vertically arranged circuit devices can have electrodes formed in substantially the same plane with the respective device such that electrodes of the vertically arranged devices can be stacked or overlapped to occupy the same planar area. This can significantly improve area scaling capabilities for the integrated circuit. Techniques disclosed herein apply to stacking of active circuit devices (such as transistors), passive circuit devices (such as resistors, capacitors, inductors, etc.) or a combination of such devices into a 3D integrated circuit. Transistors may be field effect transistors (FET) devices using fin and/or multigate configurations, for example.

Aspects of this disclosure pertain to device fabrication using gate-all-around processing incorporating nanowires or nanosheets in a FET (field effect transistor) or through a stacked complementary FET device. Gate-all-around (GAA) identifies a FET device in which a metal gate is physically wrapped around a silicon or silicon/germanium wire. GAA is a further extension of the tri-gate process of fin FETs where the gate is wrapped around a silicon or silicon/ germanium fin. With fin FETs, the gate wraps around on three of four sides of a fin, while with GAA FET devices, the gate wraps around all of the channel (whether having discrete sides or a circular wall, for example). One type of a GAA FET device is a nanowire FET.

One of the benefits of a gate-all-around or nanowire FET is that it can be used to form complementary devices in that NFET and PFET devices (and wires) can be stacked on top of one another in order to provide significant area scaling of a logic device. Conventional circuit devices are designed such that all NFET wires are positioned at one end of the device, and all PFET wires are positioned at the opposite end of the device. In a 3D complementary FET device, the NFET and PFET wires can be stacked directly on top of one another. For example, a multigate NFET device having multiple NFET nanowires (arranged in vertical or horizontal arrays) can be stacked on top of a multigate PFET device. Similarly, an NFET consisting of a single nanowire can be vertically stacked on top of a single nanowire PFET device. This stacking enables a circuit in which each nanowire has direct access to a specific terminal of the circuit device. For example, a 3-D SRAM may include an upper nanowire that can provide access to a bit-line contact in the SRAM (static random-access memory) device, a lower NFET wire can independently contact to VSS (negative supply voltage), a bottom PFET wire can independently contact to VDD (positive supply voltage), and so on. The ability for each wire to independently contact to a specific terminal of the device provides a significant area scaling benefit. When FET devices such as nanowires are complementarily stacked overtop of one another (mixing NFET wires and PFET wires), each requires an individual electrode within the S/D (source-drain) bar that is separated by a dielectric film to prevent capacitive charging between electrodes.

One challenge with complementary FET structures has been with the complexity of the MOL (middle-of-line) interconnect and BEOL (back-end-of-line) metallization layers required to enable connection to individual electrodes within the S/D bar. For a simple SRAM where there is only a PFET and NFET wire stacked complementarily on top of each other, the middle of line (MOL) and backend of line (BEOL) metal becomes quite crowded.

For example, the first via level (V-1) and the first metal layer (M0) may be used to define cross-coupling of the SRAM inverters and provide a pedestal for word line (WL) connections up to M1, and to provide VDD, VSS, bit line (BL), and BLB contacts of the SRAM up to M2. In this example, the pattern density at M0 is quite complex and requires increasing the size of the SRAM cell in order to fit in the combination of cross-coupling local interconnects and pedestals for WL and VDD/VSS contacts up to M1 and M2, respectively.

When connecting from BEOL metal down to the individual S/D bar electrodes, the contacts may be done by patterning contacts into the necessary electrode and wrapping an inner spacer of thickness set by the dielectric needs to prevent capacitive charging between electrodes. For example, as the number of stacked lateral nanowires increases, so will the number of contacts going down to the necessary S/D bar electrodes. For a 2 stacked wire configuration, doing such a process of making a contact down to the lower electrode is possible with added congestion in the MOL and BEOL. For a 3 stacked wire process and above, another solution is desirable to prevent further congestion and/or an increase in area scaling of the device to compensate.

Techniques herein include structuring the S/D bar electrodes so that these electrodes can make individual contact to BEOL metallization layers incorporating self-alignment capability to enable significant area scaling benefits associated with stacking NFET and PFET wires complementarily. Techniques include overlapping "stair-cased" or step-shaped source-drain electrodes. A repeatable process can be done to form an increasing "step-like" progression in the S/D electrodes, where each step produces a self-aligned contact which extends up to the MOL and BEOL metal.

This device configuration and method enables each nanowire device to have an individual connection to any terminal in the device and as such moves much of the MOL and BEOL wiring complexity down to a more simplistic layout where the wire separation is done through/within the S/D bar. FIG. 1 is a schematic illustration of a cross-section of a stacked complementary FET device according to embodiments of the disclosure. In the particular example of FIG. 1, a cross-section of an array of four SRAM memory cells is shown. In FIG. 1, circles show nanowire cross sections, where PFET wires 101 are shown in a circled "P" and NFET wires 103 are shown in a circled "N." The nanowires are surrounded by S/D metal fill material 105 which forms step shaped electrodes. Angled hatch lines 107 indicates a dielectric film that is selectively deposited on each step of the electrode as each electrode is formed—without being deposited on uncovered/exposed nanowires—in a stair-casing fashion, having a step-shaped cross-sectional profile as discussed further below. The unlabeled nanowires 109 do not provide active transistors in the portion of the cells shown in cross-section, but nanowire stacks immediately behind or immediately in front of the wires 109 (i.e., in other cross-sections) can be used as active transistors for the same cell or for a different cell. Thus, unlabeled nanowires 109 can be considered as place holders. Unlabeled nanowires 109 on the lowest level would also be PFET wires, while unlabeled wires 109 on the middle level would be NFET wires. As the nanowires extend through a substrate they can be used as active FET devices in some S/D regions of a memory cell, while not being used as FET devices in other S/D regions depending on a design of a given device. In some embodiments, the unlabeled wires 109 may be used to electrically couple active transistors to one another or to other electrical components. An example of using the unlabeled nanowires for cross coupling the inverters of a six transistor SRAM circuit is described in U.S. provisional application No. 62/372,106 which is incorporated herein by reference.

Stair-case structures have been used for 3D NAND devices where control gates are formed within a FET array and a stair-case electrode structure is established outside of the array in order to make contact to each control gate. The case of 3D NAND requires the stair-case structures to be outside of the immediate array and requires significant area to fit the stair-case on a chip. With techniques herein, however, step-shaped wiring is overlapping and formed within a S/D region (or within a gate region) which is physically part of a 3D logic array. With this arrangement, there is little or no area scaling loss associated with building a stair-case in a device of this disclosure compared to a conventional device.

Accordingly, disclosed techniques include forming multiple electrodes within a source/drain (S/D) bar within a logic device, with the multiple electrodes being step-shaped and stacked with respect to one another within the S/D bar to enable contact to individual wires in a stacked nanowire flow. This structure effectively enables a device that has multiple S/D bars within the area of a single S/D bar since each electrode is physically and electrically separated from one another. Hence, wires can be stacked complementarily over top one another and each wire can be connected individually to a unique terminal circuit within the device. This configuration enables NFET wires to be stacked overtop PFET wires (vertically stacked), as opposed to the conventional arrangement of having NFET and PFET wires or fins being physically separated out on either end of the device. Stacking NFET and PFET wires enables significant area scaling of a given device. This structure can be considered as NFET wires being folded overtop the PFET wires.

As discussed above, for the case of a fast-performing SRAM where NFET wires are stacked overtop PFET wires, the S/D bar can be formed comprising three separate electrodes. Returning to FIG. 1 for example, bottom electrode 115 is used for VDD contacting to PFET 101, middle electrode 113 is used for VSS contacting to middle NFET 103, and one electrode is used for BL (or BLB) contacting to upper NFET 103. The step-shaped pattern can be seen in FIG. 1, where a repeating pattern of a separated electrode with a protruding contact-up extension can be produced and layered on-top of each other, where each step encases a respective wire to be contacted.

In a simplified process flow, a lowest/first/bottom electrode 115 being step-shaped is first formed and then a dielectric barrier 107 is selectively deposited overtop the metal electrode 115. This process is repeated for each additional wire such that a second step-shaped wire ("step") 113 rests on the first step 115, a third step-shaped wire can rest on the second step 113 and so on. The process is repeated as many times as designed or specified in order to accommodate all wires that are connected to individual terminal within the device. In the example of FIG. 1, a final wire electrode 111 can be embodied as a metal plug deposited on a remaining (i.e., last formed) step/shelf.

As seen in FIG. 1, each "step" encompasses a desired conductive wire or line 121 as well as an extension 123 (vertical component) that connects the electrode to the upper metallization layers by means of a contact 125 which can connect to the metal extension-up. The method for producing such a structure for the example case of a fast-performing complementary FET SRAM is shown in FIGS. 2-12 and discussed in detail below.

Benefits of techniques herein include significant area scaling realized through enabling the stacking of NFET and PFET wires on top of each other in a complementary FET device. Instead of having to run multiple S/D bars as individual bars across the cell, the S/D bars for each device can all be contained vertically and insulated from each other within a common S/D bar structure. Structures herein enable easier sharing of electrodes between cells. As seen in FIG. 1, for the case of SRAM, this enables VDD and VSS to be shared east-to-west (i.e., a direction intersecting a length direction of the nanowires) in a method where a single contact 125 can make connection to two adjacent SRAM cells (for example the VSS contact common cell 1 and cell 2). Typically this is done through having contacts at each access point at M0 level and feeding up to a common connection at M1 level. With technique herein, however, only one single contact is necessary. For embodiments in which more than three electrodes are required, any concern with resistivity from the contact in the metal extension region of the stair-cased S/D bar to the bottom electrode can be adjusted by making the connection downward to a buried rail. With the buried rail concept, the power rails are patterned and metalized underneath the active device and are embedded in either the STI oxide under the S/D bar and metal gates, or within the STI oxide and bulk silicon between where the initial FIN structures are patterned. The buried rails provide further congestion relief for the scaled logic devices in the back-end of the line (BEOL) which, for the case of buried power rails, only now need support routing lines. By burying the power rails in a complimentary FET device, the connections to Vdd and Vss need to only go downward to tap the buried power rail; which makes for the case of the SRAM, upward connections to BEOL metal layers to only be needed for the upper-most electrode in the S/D bar. The design for the stack electrodes makes this implementation significantly easier for manufacturing.

In a complementary FET device, the NFET and PFET wires are stacked overtop of one another in order to provide an area scaling benefit. As noted above, in conventional FET devices, the NFET and PFET wires are located on opposite ends of the cell. For logic devices in the case of SRAM, this placement effectively doubles the area required by the device. There are various different types and configurations of FET devices. For convenience in describing embodiments herein, description will primarily focus on a complementary FET fast-performing SRAM in which NFET over NFET over PFET wires are used to area-scale a given device. Note that techniques herein are readily applicable to any 3D logic device. Note also that the lateral stacking of electrodes can be done in any order to satisfy optimal routing; namely PEFT electrode and wires can be stacked overtop NFET electrode and wires if this makes BEOL routing easier for random logic cells.

FIGS. 2-12 are cross sectional perspective views to illustrate one example process for forming a 3D SRAM according to disclosed embodiments. FIGS. 2-12 provide a 3D SRAM structure being fabricated to show an example process flow and techniques for forming a stair-cased or step-shaped source/drain (S/D) that can enable local interconnection among individual wires that exist in a stacked complementary FET structure. A starting point for this example flow is after gate metallization has been completed, and metallization of the S/D bar is now to be created. At this point in the processing, silicon or silicon-germanium (SiGe) nanowires have been cut within the S/D bar region and recessed into the gate spacer, and S/D epitaxial doped SiGe or Si has been grown from the ends of the exposed nanowires. Examples for forming source and drain regions in a 3D FET circuit are described in U.S. provisional application No. 62/373,164, which is incorporated herein by reference. Thus, the S/D bar in this starting step is essentially bordered by gate spacer material in which Si and/or SiGe epi has been grown. Gate spacer material may be SiOC, SiN, SiOCN or any other suitable material which insulates the gate from the S/D bar. A thin film of metal such as titanium can be deposited by ALD within the S/D bar in order to make a MIS (metal-insulator semiconductor) contact followed by a dielectric liner deposition such as TiN. The remainder of the S/D bar can be filled with a dielectric such as SiO at this point in the processing.

Figure 2:
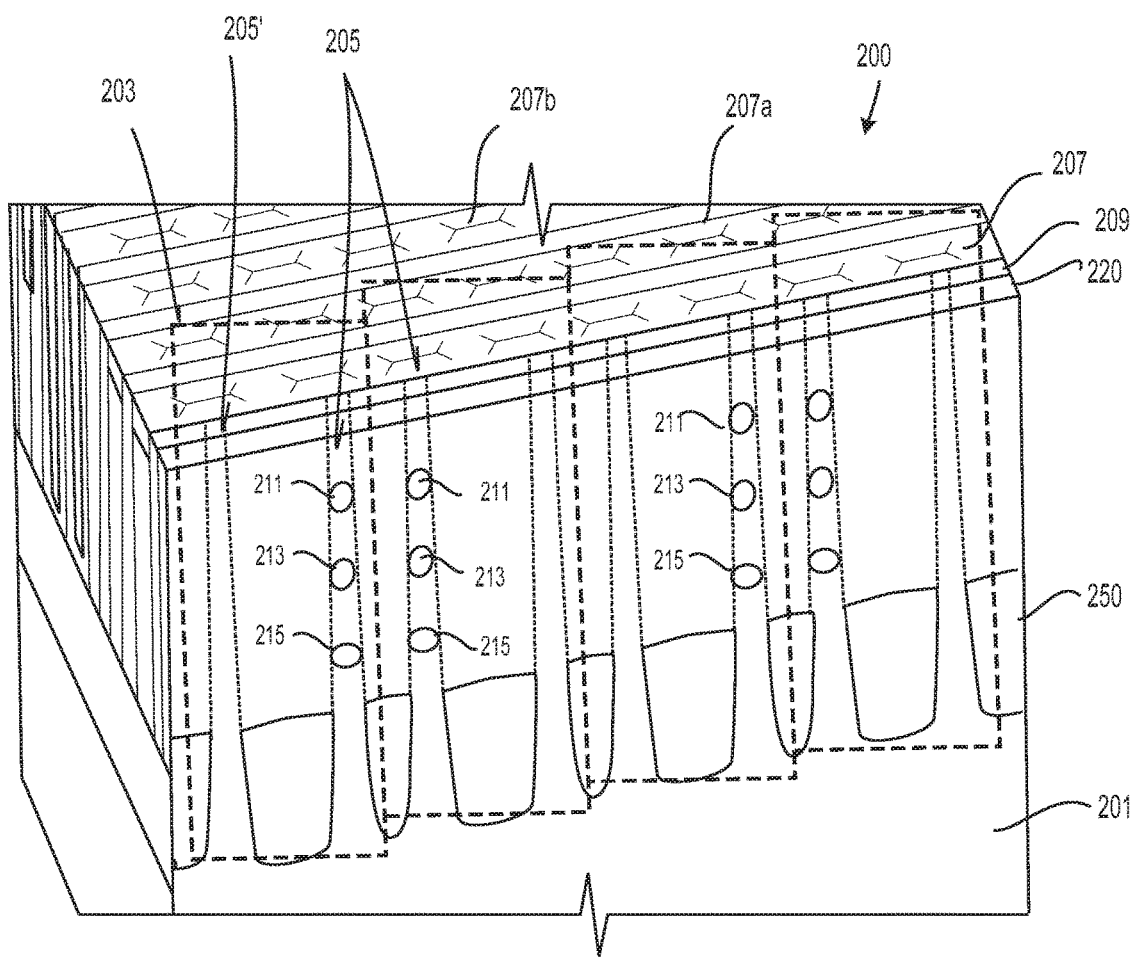
FIG. 2 is a cross-sectional perspective view of an example starting structure for forming a 3D SRAM according to embodiments of the disclosure.

FIG. 2 is a cross-sectional perspective view of an example starting structure for forming a 3D SRAM according to disclosed embodiments. Structure 200 includes a substrate 201 on which multiple SRAM cells are formed. The substrate may be a monolithic substrate of semiconducting material such as Si or SiGe, for example. Shallow trench isolation regions (STI) 250 are schematically shown. The dotted lines 203 delineate the "border" of each SRAM cell, which includes the three nanowires shown in the cross-section, as well as three nanowires provided in another stacked structure at a different cross-section (either behind or in front of) the cross section shown. Thus, a cross-section is shown along an array of 4 SRAM cell regions 203, each of which includes six nanowire FET devices.

As seen in FIG. 2, the structure 200 includes a gate region 207 having gate spacers (low-k spacers) 209 on opposing sides of the gate region 207. Gate spacers 209 will border the S/D bar yet to be formed. In this process flow, an SiO deposition can fill the source/drain bar region for further processing. In FIG. 2, SiO fill 220 is shown but the cross-section is provided through the S/D epi regions 211, 213, 215 to emphasize where the wire (i.e., source/drain epi) is present. Gate regions 207a and 207b depict similar structures at different cross-sections to provide portions of an SRAM cell.

Each cell 203 includes a stacked nanowire structure 205 which includes three vertically stacked lateral nanowires. The stacked nanowire structure 205 may be formed from a fin of alternating layers of Si and SiGe material, for example; this original fin structure is shown in phantom in FIG. 2 for reference. In the example of FIG. 2, each wire stack 205 includes an NFET wire 211 as the top wire, which will connect to BL and WL lines of the SRAM. Another NFET wire 213 (middle) will connect to VSS of the SRAM, and PFET wire 215 (bottom) will connect to VDD of the SRAM. Unlike FIG. 1 above, the unlabeled or "placeholder" nanowires are not shown in FIGS. 2-12. However, it is to be understood that the additional active nanowires (behind or in front of those shown) of each cell may be provided in a placeholder position 205'. Thus, in one embodiment, a planar view of the cell region 203 includes a stack 205 of three nanowires located in diagonal relation to another stack of three nanowires provided behind the placeholder position 205.

In the example of FIGS. 2-12, the nanowires in the gate region are composed of silicon (though techniques herein apply to SiGe wires or other types of semiconductor wires). As such, the PFET 215 wires on the bottom of the wire stack 205 have boron doped (B-doped) SiGe source-drain epitaxial growth ("epi") extending from the end of the silicon wire which is protruding through gate spacer 209. The NFET wires 211 and 213 each have phosphor doped (P-doped) silicon source-drain epi extending from the end of the silicon wire. In describing FIGS. 2-12, the doped SiGe epi source/drain regions are considered to be part of the silicon nanowire.

Figure 3:
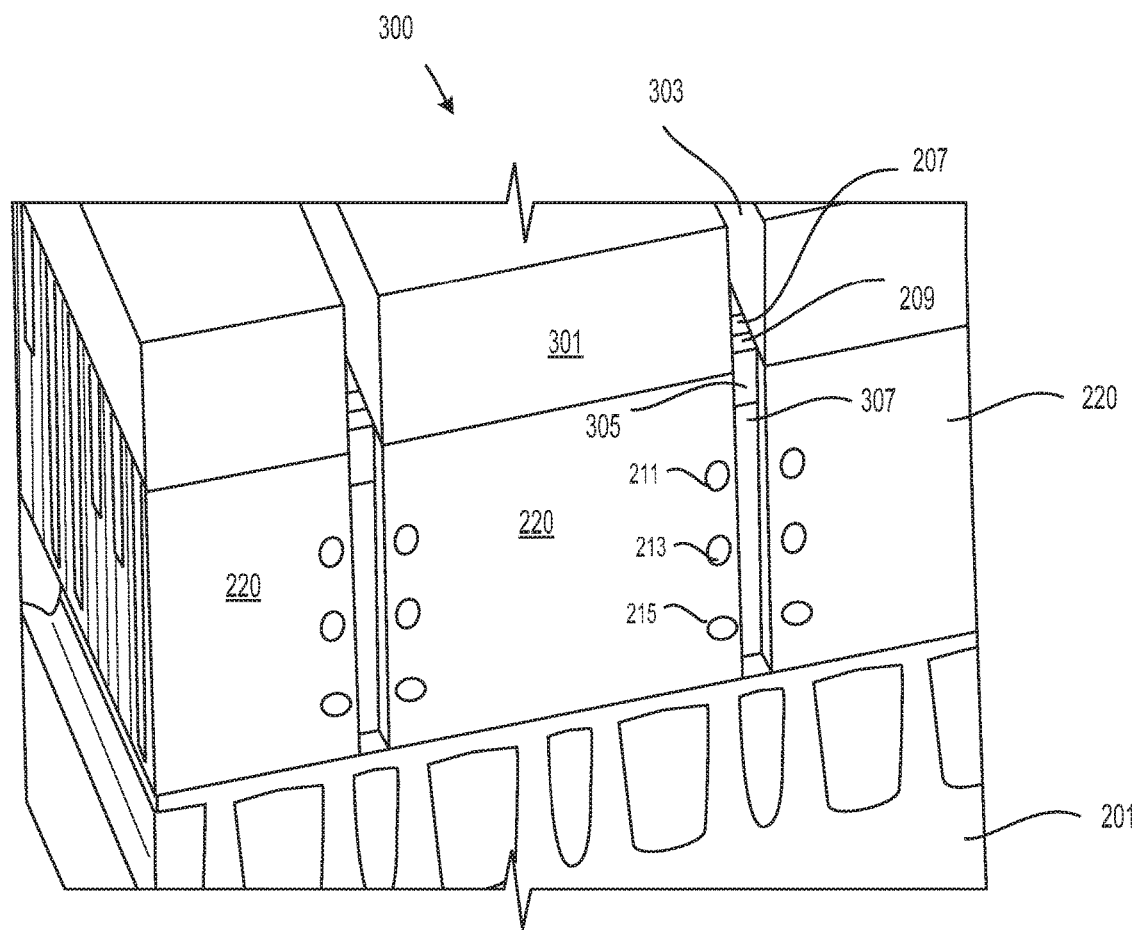
FIG. 3 is a schematic illustration of a structure depicting an isolation step according to embodiments of the disclosure.

Each cell region 203 can be isolated from each other. FIG. 3 is a schematic illustration of a structure 300 depicting cell isolation step according to embodiments of the disclosure. Such cell isolation can be executed by forming a patterned hardmask 301 over the device defining a series of trenches or openings 303 for etching an isolation trench 305 into the SiO fill material 220 within the S/D bar. Trench 305 reveals liner 307 which extends part way up the gate spacer wall 209. The liner may be formed of a Ti/TiN layer or any other suitable material. A given size of the isolation trench 305 can be set to be equal to that needed by a corresponding contact that will eventually make connection from the BEOL metal down to the electrode in contact with each of the various nanowire "levels." This isolation trench 305 can become a direct contact from BEOL to the electrode "floor" by means of removing the isolation material and replacing with S/D bar metal as discussed below.

Figure 4:
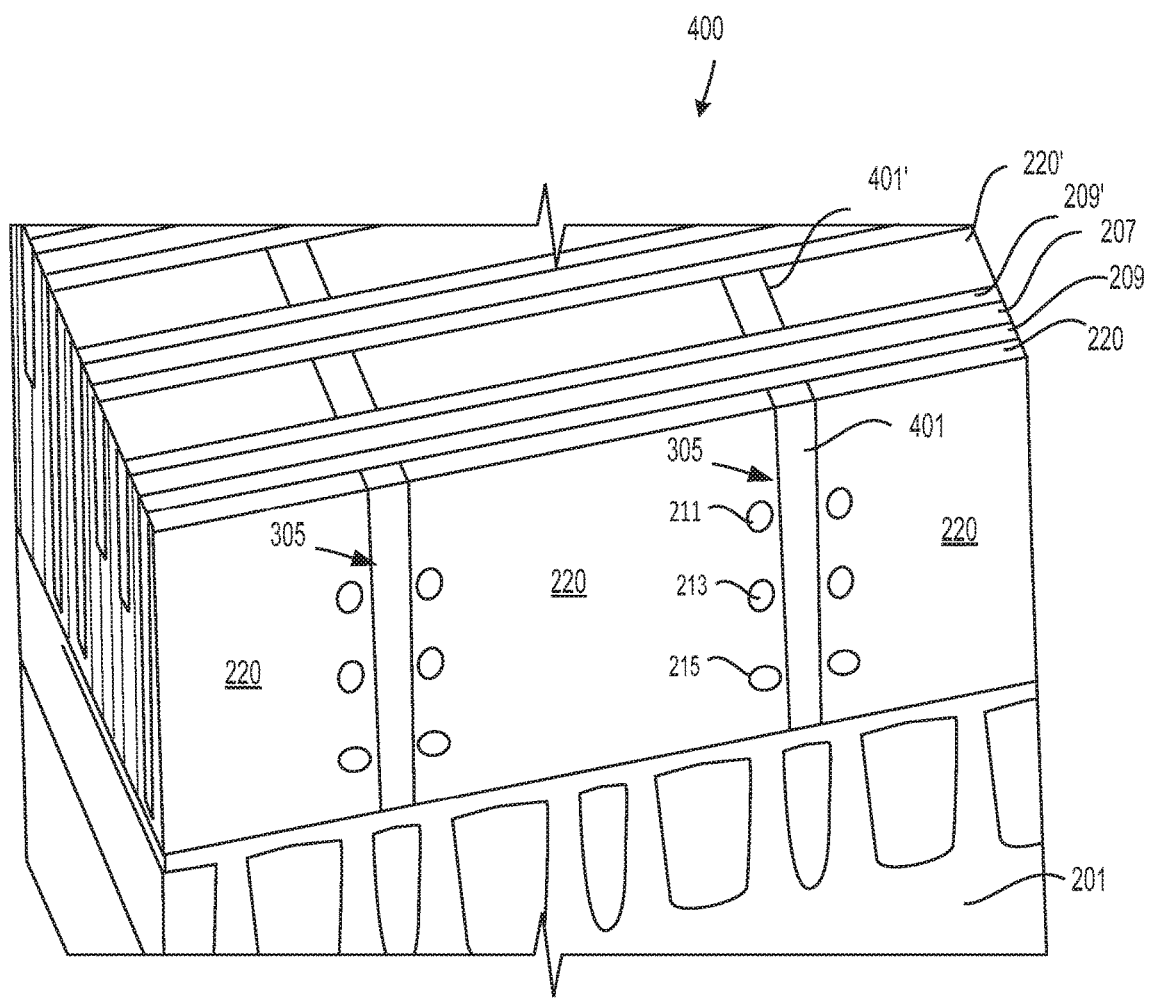
FIG. 4 shows selective fill material within an isolation trench according to embodiments of the disclosure.

After the isolation trench 305 is opened within the SRAM array, it is filled in with a selective fill material 401 that is selective to other materials within the S/D bar. FIG. 4 shows selective fill material within an isolation trench according to embodiments of the disclosure. As seen, the structure 400 includes fill material 401 that is selective to the SiO 220, the gate spacer material 209 and the dielectric cap material typically formed over the gate in gate region 207, which may be SiN, for example. In the example of FIGS. 2-12, a doped carbon fill material is used as the fill material 401, which can fill in the openings and then be easily stripped out later in the process. Gate region 209', SiO fill 220' and fill 401' for an S/D bar region being formed behind the S/D bar shown in cross section. A Ti/TiN liner is covered by the fill 220 in FIG. 4.

The SiO 220 can be selectively removed through an isotropic etching process such as vapor-phase etch process. This process can be performed using a CERTAS tool manufactured by Tokyo Electron, Ltd., for example. Such an etch should be able to wrap around the protruding S/D epis of wires 211, 213, 215 within the S/D bar and have very high selectivity to other materials (such as 100:1 etch selectivity or more) so that the SiO 220 is etched without etching the gate spacer materials, the ALD Ti/TiN liner that covers the S/D epi materials, and the filling material 401 (e.g., doped carbon) which had been filled within the trenches 305. Thus, selective etch of the SiO fill 220 should result in exposure of the Ti/TiN liner 307 on the gate spacer sidewall 209 and on protruding nanowires 211, 213 and 215. Note that conventional plasma-based isotropic etching may be insufficient to etch completely around nanowires 211, 213, 215 as there is still some directionality with plasma-based etching as well as usually insufficient selectivity. Thus a fully isotropic etch, such as vapor-phase chemical oxide removal can be beneficial.

Figure 5:
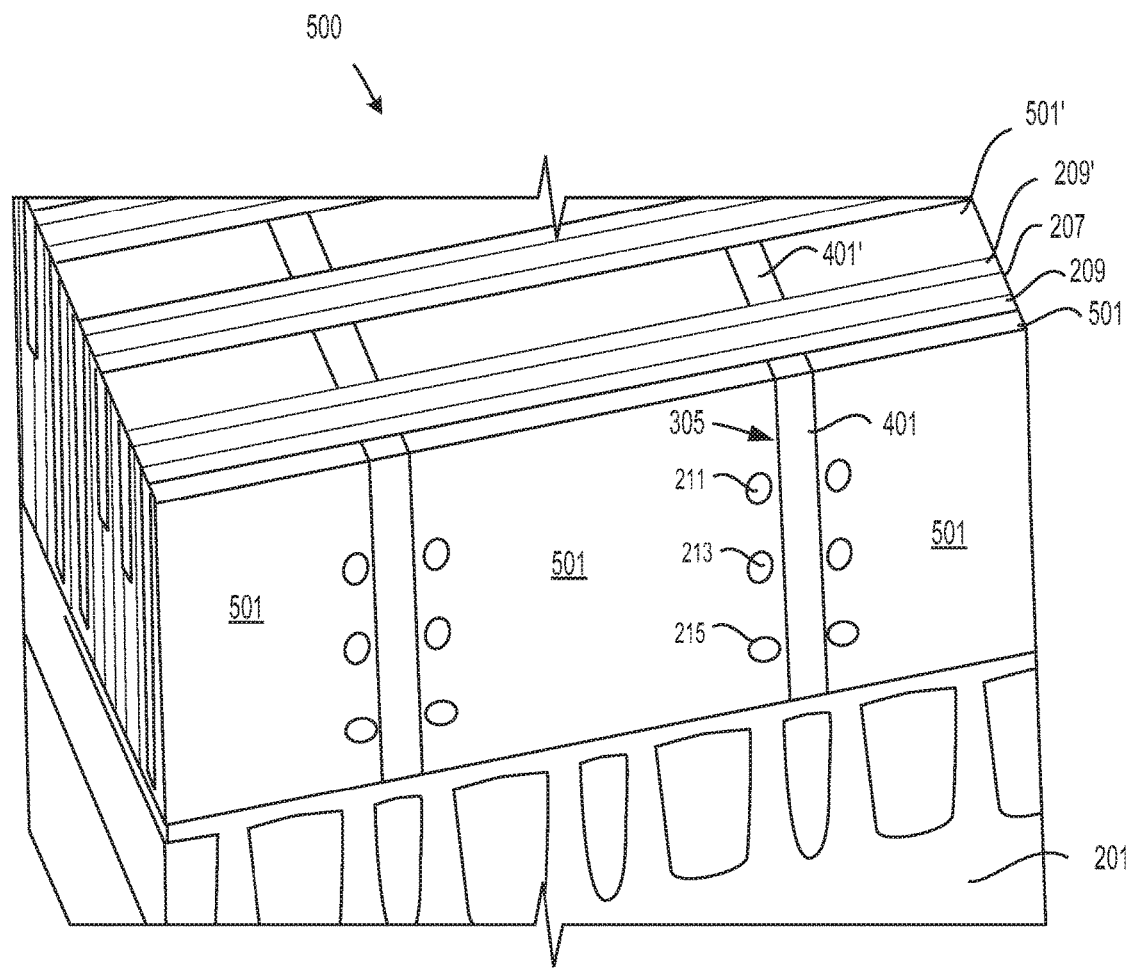
FIG. 5 shows a structure after S/D metal fill is provided in the S/D bar in accordance with embodiments of the disclosure.

The opened S/D bar (with SiO 220 removed) is then filled with a S/D metal. FIG. 5 shows a structure after S/D metal fill is provided in the S/D bar in accordance with embodiments of the disclosure. Structure 500 can be formed by filling the S/D bar with metal 501, which is then polished to planarize the metal fill 501 to a surface of the cap existing over the surface of the metal gate region 207. Thus, the metal fill 501 can have an over burden which is planarized back. As seen in FIG. 5, the metal fill 501 replaces the SiO fill 220 of FIGS. 1-4. Metal fill 501' is also shown on another S/D bar region. Metal fill 501 may be cobalt, ruthenium, or any suitable conductive material. In the examples of FIGS. 2-12, cobalt is used.

Figure 6:
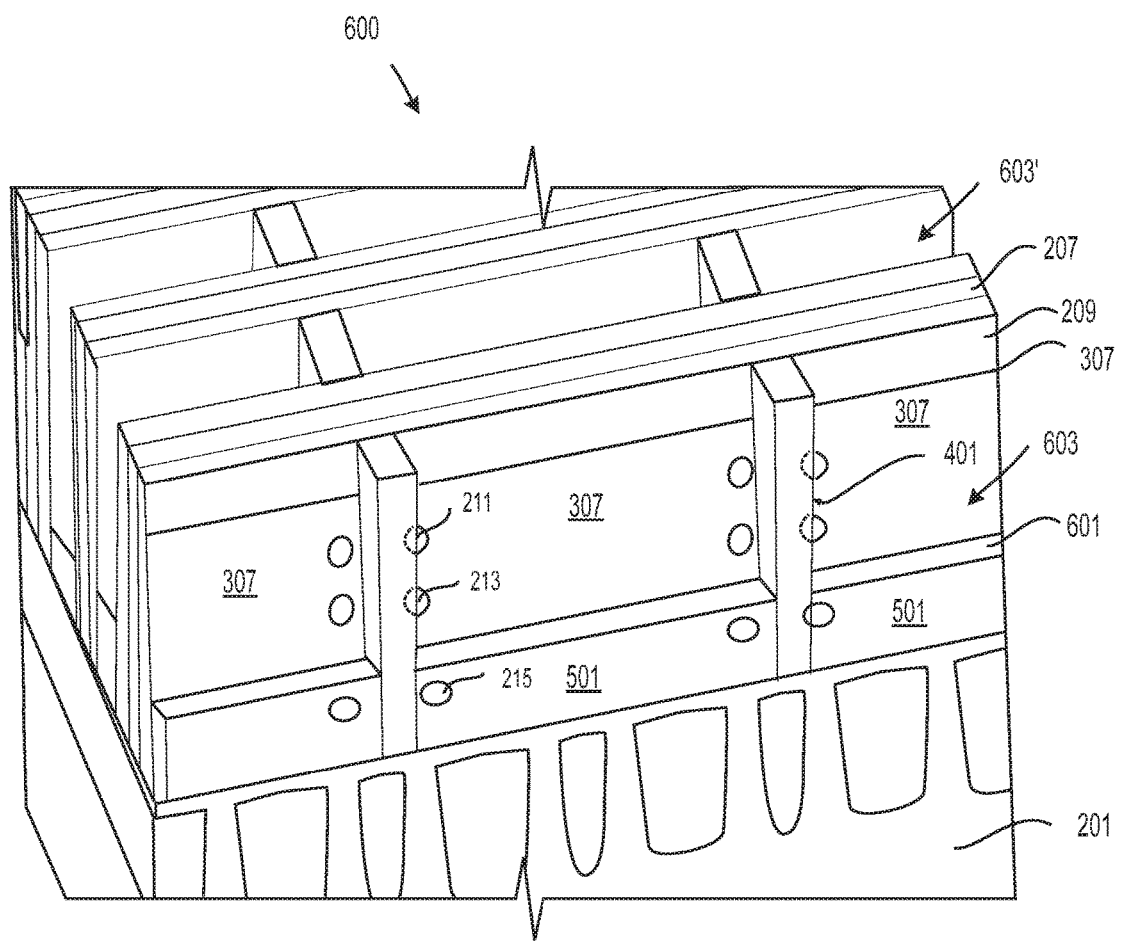
FIG. 6 shows an example structure after etch defining the lower electrode in accordance with embodiments of the disclosure.

Once the S/D metal is filled, the lower "floor" electrode or lower layer channel can be defined through an isotropic etch of the S/D bar metal. FIG. 6 shows an example structure after etch defining the lower electrode in accordance with embodiments of the disclosure. Structure 600 includes lower electrode portion 601 formed from metal 501 previously deposited. As seen, etch of metal fill 501 will terminate between the levels of the bottom PFET 215 S/D epi and the middle NFET S/D epi 213. Thus, nanowires in the first level (e.g., 215) are covered with metal 501 while the nanowires in the stack above the first level (e.g., 211, 213) are uncovered. As seen in the cross-section of FIG. 6, fill 401 is protruding from the gate spacer 209 and liner 307 provided thereon.

The isotropic etch of the S/D metal 501, like the SiO 220 removal etch discussed above should have selectivity to all other exposed material such as the Ti/TiN liner, gate spacer 209, fill 401, etc. In cases where there are limitations with selectivity between cobalt and atomic layer deposited (ALD) Ti, for example, then the ALD Ti film can be optionally removed after annealing between the Ti and the S/D epi materials (SiGe/Si) before the S/D bar is opened. The Ti can be either (1) selectively deposited only to the surface of the S/D epi and not require any subsequent removal from non-epi areas of the device; or (2) when a simple ALD Ti film is deposited, it will form TiSi on the surface of the S/D epi and the rest of the device will be covered in ALD Ti which can be selectively removed selective to TiSi. Both processes should be considered as "known art". As seen, the bottom or "floor" electrode 501 (which will form the VDD contact) protrudes from the Ti/TiN liner 307 provided on the gate spacer 209.

Executing such metal isotropic recess etches with equipment such as TEL CERTAS system may be beneficial in that the vapor-phase etching can be a cyclic process. As such, each cycle of etching will result in a fixed amount of metal recess. This amount of recess per cycle can also be modulated so that self-alignment of the recess can be achieved simply through the number of cycles used in a given recess etch. Since the metal is initially processed through CMP to stop at the surface of the dielectric cap of the metal gate region 207, this renders an effective "zero point" for which the cyclic recess etch process can achieve some semblance of self-alignment in the z-height orientation in the example flow discussed. FIG. 6 shows the metal fill 501 having been recessed to create a metal channel 601 or metal component occupying the first nanowire layer.

Figure 7:
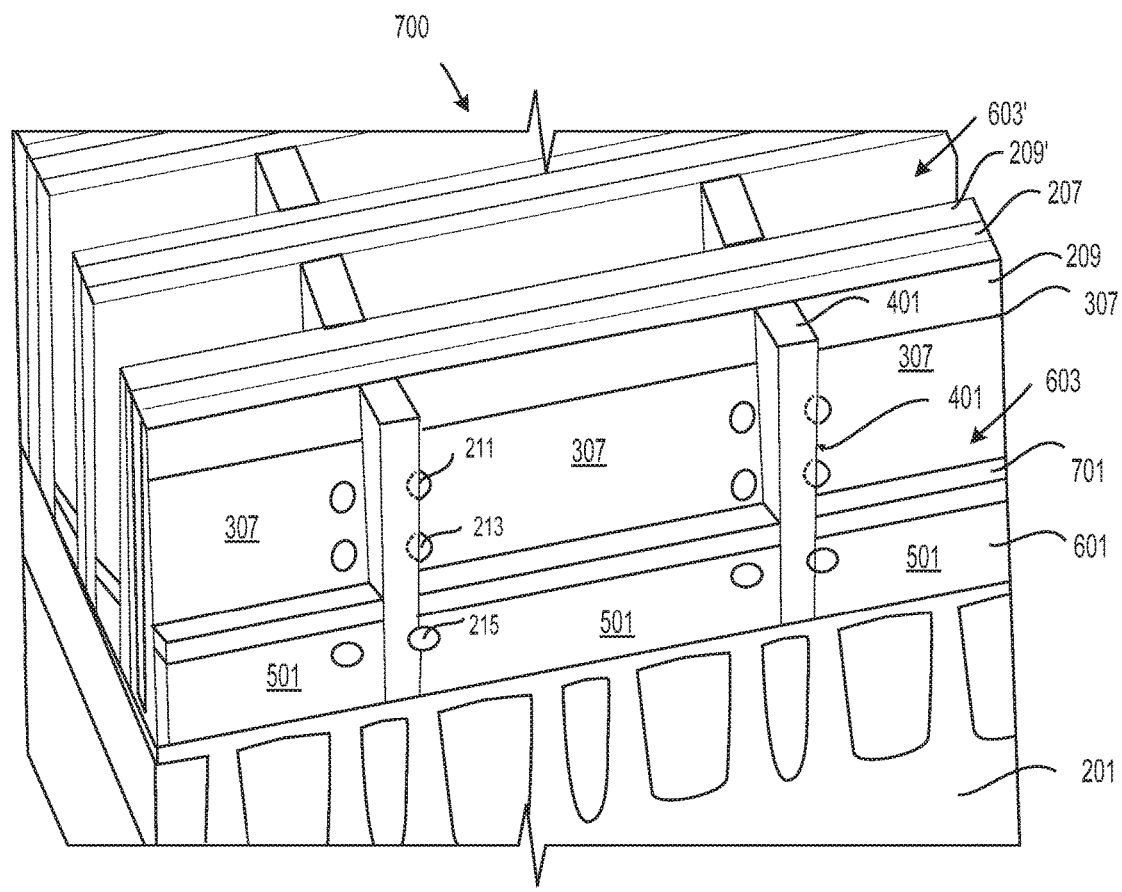
FIG. 7 shows a selectively deposited dielectric layer formed over the lower channel metal according to embodiments of the disclosure.

With the lower "floor" electrode defined through isotropic recess etch process, the lower channel is then isolated from the upper channels. This isolation process is accomplished through a selective deposition process. Selective deposition is a deposition process analogous to selective etching. FIG. 7 shows a selectively deposited material formed over the lower channel metal according to embodiments of the disclosure. With selective deposition, a material is deposited or grown on certain material(s) without being deposited on other or remaining materials. As seen in FIG. 7, material 701 is selectively deposited on electrode portion 601. For example, aluminum oxide (AlO) and AlO/SiO can be selectively deposited over top of Cobalt (Co)/CoAl, and not deposited on any of the other opened materials in the S/D bar of the example flow in FIGS. 2-12 (TiN liner, doped carbon trench fill, SiN cap, etc.) Such deposition is beneficial because it is desirable to avoid depositing dielectric material on uncovered nanowires of the stack 205. Accordingly, selective deposition of this deposit material underneath the protruding S/D epi 213 can make a continuous film over the bottom S/D metal "floor."

An alternative to selective deposition process in this flow is to deposit dielectric fully within the S/D bar, followed by CMP, and then by selective etch recess. This process is more challenging than the previous step where the S/D bar metal 501 was recessed to form the lower floor channel 601, since the edge placement of the stop of the previous step was simply between two S/D bar epis (213 and 215) which are typically spaced between 30-40 nm apart from one another. Using such a recess etch (instead of selective deposition) may be challenging because the recess needs to stop precisely to form the necessary dielectric thickness which is on the order of 5 nm. Thus, selective deposition may be the preferred option because the thickness of the dielectric film is controlled through a fixed deposition process with better tolerance for final film thickness uniformity (and hence capacitance). Moreover, selective deposition generally has fewer process steps and may avoid undesirable CMP and challenging recess etch processes.

Figure 8:
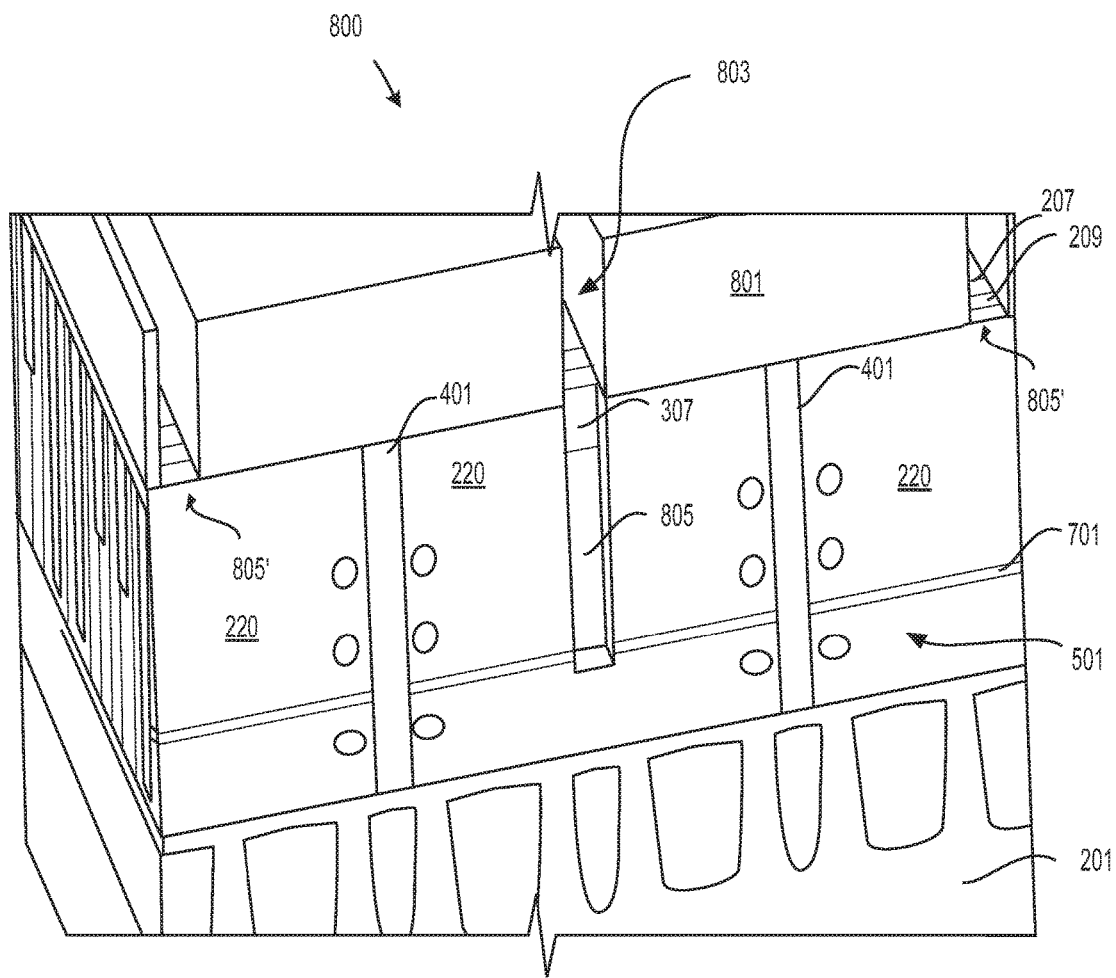
FIG. 8 depicts a process for forming a second isolation trench according to embodiments of the disclosure.

The S/D bar is then filled with SiO 220 or some other type of film that has selectivity to the bottom dielectric liner 701 (e.g., AlO) and the TiN liner 307 covering the wall of the S/D bar. Once the SiO 220 is deposited, it can be CMP polished back to the top of the metal gate dielectric in gate region 207 and provides a floor for which a second isolation trench can be patterned. FIG. 8 depicts a process for forming a second isolation trench according to embodiments of the disclosure. As seen, the structure 800 includes SiO 220 in the S/D bar. Again conventional lithographic patterning processes can be used to create a patterned etch mask to create an opening through the fill material 220 down to the floor electrode. As seen in FIG. 8, a formed etch mask 801 is provided on the substrate 201 and includes openings 803. This second etch mask 801 serves to form a boundary for the next "step" or "floor" in the stair-case structure. The trench 805 is opened up into the SiO 220 (or other fill material within the S/D bar) and stops at the surface of the selectively deposited dielectric film 701 over the bottom "floor" metal electrode 501. Once the trench reaches the top of the film 701 (AlO in this example), the film 701 is punched through to uncover the metal 501 underneath. For purposes of illustration, the structure 800 of FIG. 8 shows trench regions 805' before etch of the SiO fill 220, and the trench 805 after etch of trench fill 220 and dielectric 701.

Figure 9:
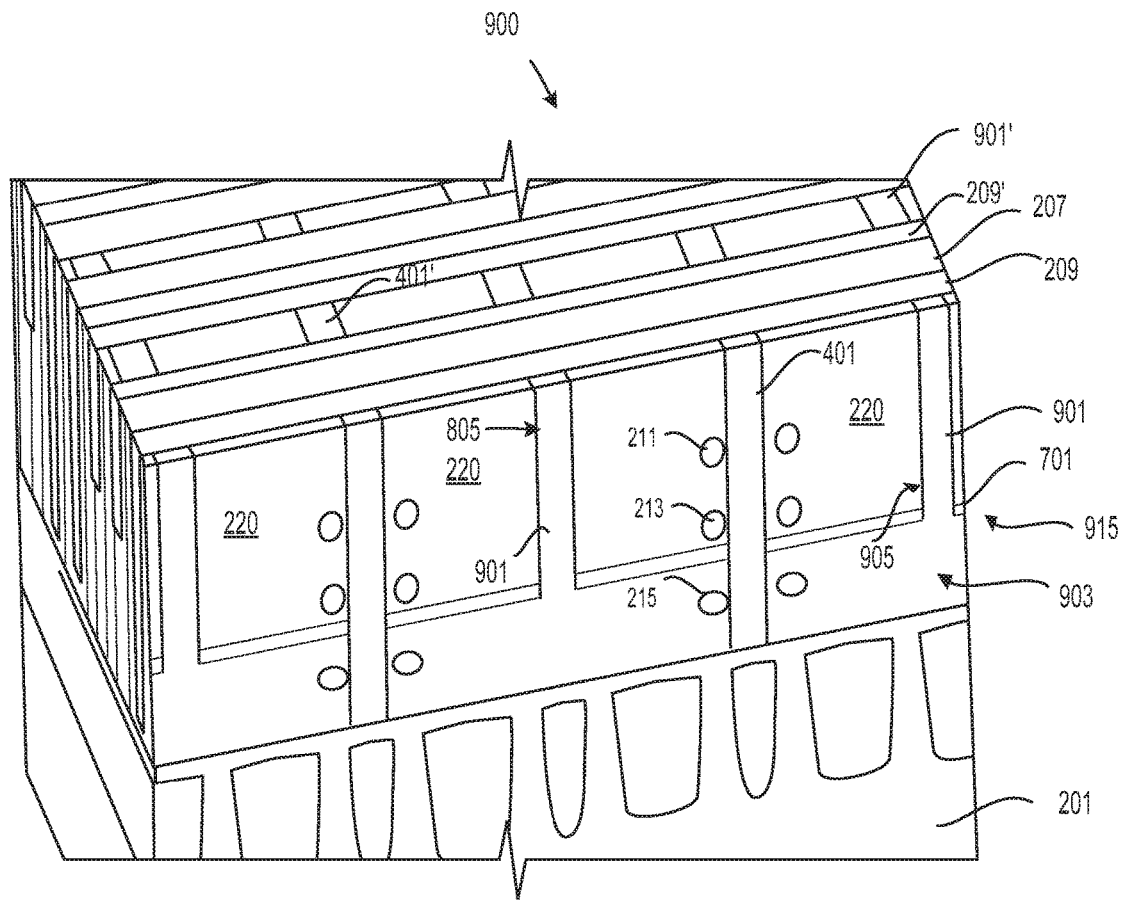
FIG. 9 illustrates a process for forming the contact up portion of the lower electrode in accordance with embodiments of the disclosure.

The opened trench 805 down to the lower level metal 501 is then filled with S/D metal. This fill provides the "contact up" portion of the electrode to provide access from the bottom "step" or "floor" electrode to the surface of the S/D bar where connection to middle-of-line (MOL) or BEOL metal can be achieved, and also provides an edge for which additional selective deposition processes can be executed to further isolate the bottom electrode and the extended "contact" up to the MOL/BEOL module. FIG. 9 illustrates a process for forming the contact up portion of the lower electrode in accordance with embodiments of the disclosure. Structure 900 includes metal 901 deposited in the opened trench 805 and then a CMP step can be used to bring the S/D metal 901 back to the height of the dielectric cap over the metal gate 207. In the CMP process, an SiO hardmask (which may be used as a transfer layer from the lithography trench to the S/D SiO can also be removed as the CMP would terminate on the SiN cap over the metal gate 207. Thus, the first electrode 915 to the bottom nanowire has a horizontal component 903 ("wire" or "line") or member, and a vertical component 905 or member ("contact up"). Together, this electrode 915 has a step-shaped profile as shown in FIG. 9.

After completion of the lower electrode metal, the electrode 915 can be fully isolated. The SiO 220 can then be removed, again through an isotropic selective etch process (e.g., vapor-phase etch). The exposed dielectric film 701 of AlO that was selectively deposited over the bottom metal electrode 501 portion can optionally be removed through atomic layer etching (ALE) or plasma etch, or can be kept. In this example flow, the AlO dielectric film 701 over the bottom Co and Co/Al bottom electrode metal 501 is removed for simplicity.

Figure 10:
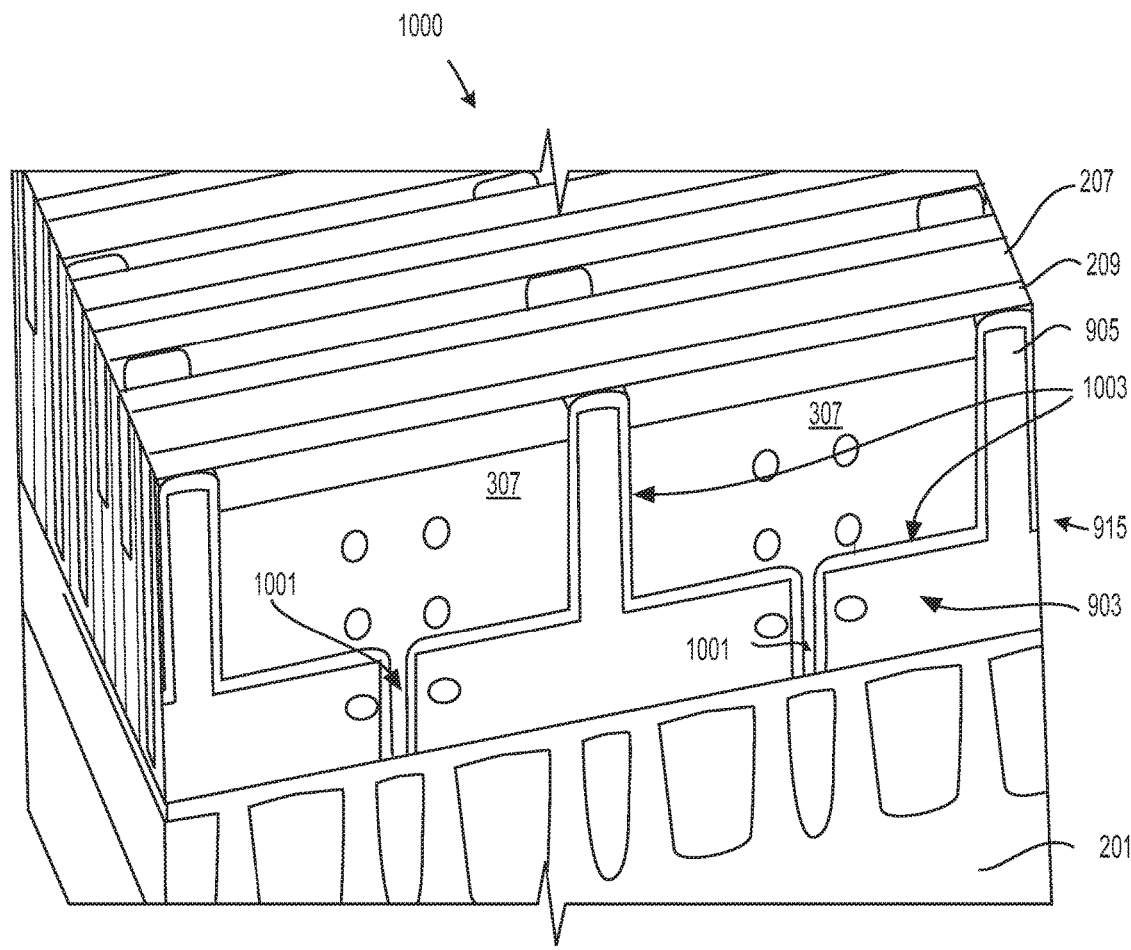
FIG. 10 shows a structure depicting the isolation of the lower electrode in accordance with embodiments of the disclosure.

The fill material 401 in the first-formed trench 305 can now be removed to uncover gaps 1001 (see FIG. 10) at the bottom of the lower-most "floor" or "step" in the bottom channel. Once the S/D metal 501 is fully exposed, another selective deposition process of dielectric can be done overtop the S/D metal 501 to isolate the bottom electrode 915. FIG. 10 shows a structure depicting the isolation of the lower electrode in accordance with embodiments of the disclosure. As seen, the structure 1000 includes a selective deposition 1003 of dielectric material to isolate the lower electrode 915 including wire portion 903 and "contact-up" structure 905 from the other "floors" or "steps" in the electrode structure.

Subsequent metal connectors or "steps" or channel floors can be patterned in a similar type of manner as the bottom channel electrode 915 and repeated as needed for the number of individual channels required. For example, subsequent process steps include deposition of S/D metal into the S/D bar, followed by selective metal recess to define the height of the next electrode/metal line. This is followed by selective deposition of a dielectric film or barrier layer over the second S/D metal channel. The remaining space can be filled with SiO again, and a third etch mask can be formed and patterned (such as with trenches) to define the "contact up" for the current electrode/metal line. The dielectric at the top of the second electrode can be opened to uncover the S/D metal to electrically connect the horizontal shelf or step with a vertical connector. Selective deposition is again used to form a dielectric barrier between second and next (third) level or floor of S/D electrode.

Figure 11:
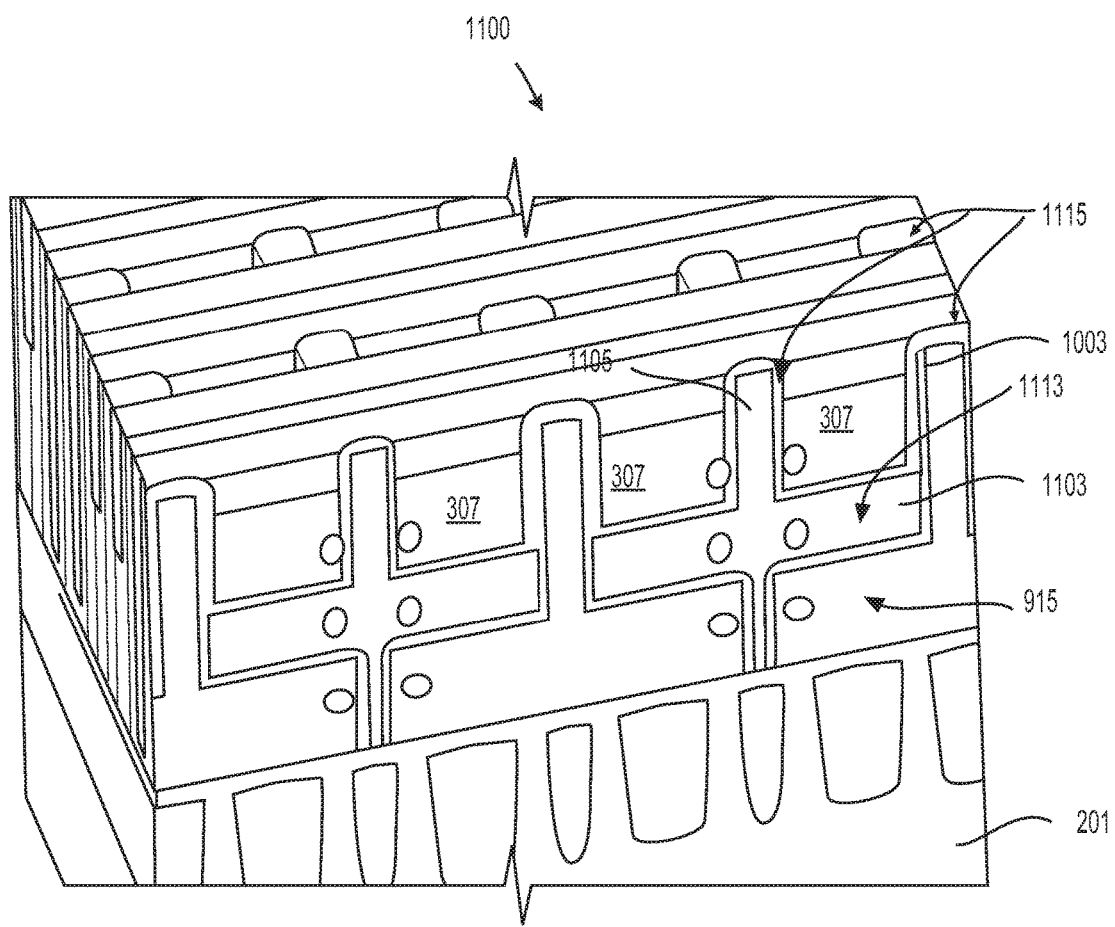
FIG. 11 shows a structure resulting from this process according to disclosed embodiments.

FIG. 11 shows an example structure after forming the second electrode according to disclosed embodiments. As seen, the middle electrode 1113 is formed on the lower electrode 915 and isolated therefrom by dielectric 1003. As with the lower electrode 915, middle electrode 1113 includes a wire portion 1103 and a contact up portion 1105. Additional dielectric 1115 is provided over the middle electrode 1113. At this stage, Ti/TiN material 307 is exposed in the region of a top electrode. Once the selective deposition of dielectric such as AlO over the middle S/D metal channel is complete, this second metal line provides a floor for the next level of metal electrode.

Figure 12:
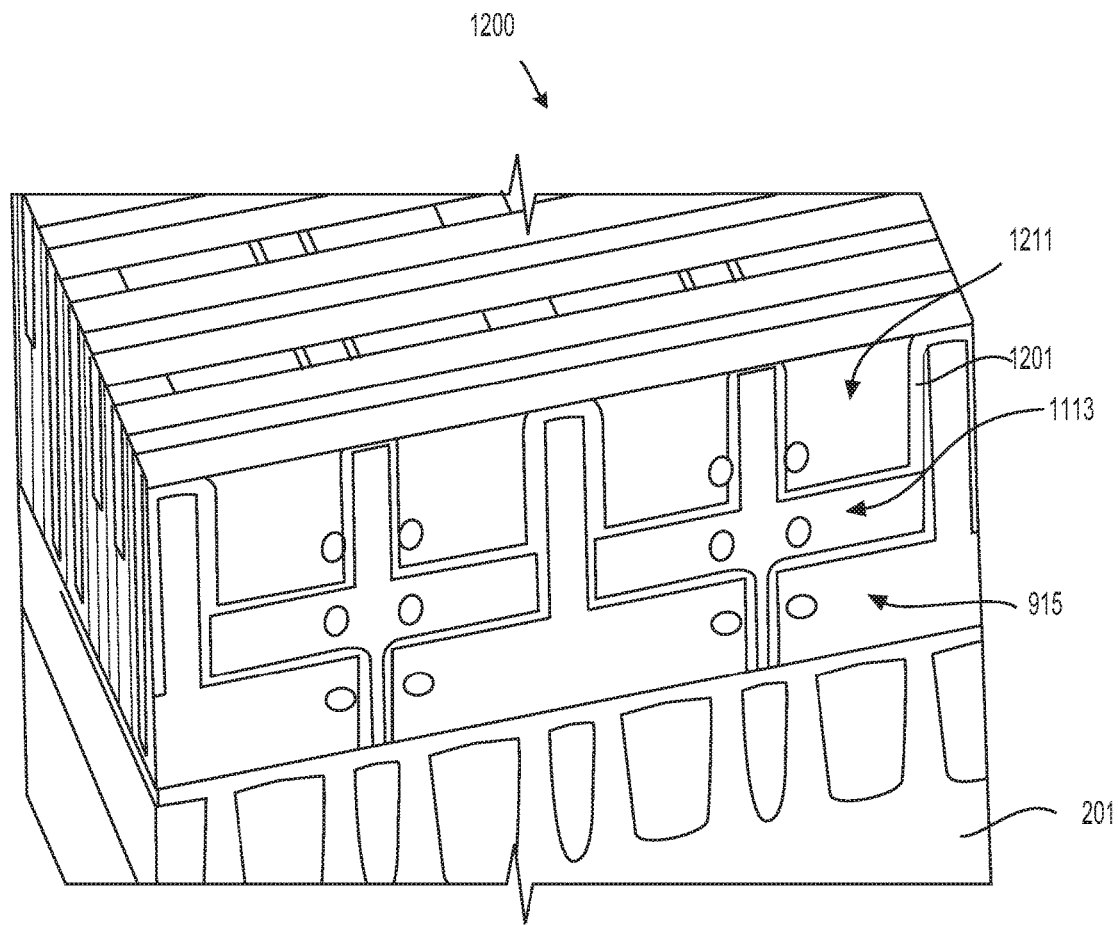
FIG. 12 shows an example structure resulting from this process according to disclosed embodiments.

This electrode creation technique can continue for however many levels of stacked nanowires exist in a given device or substrate. A final or upper electrode (in this example the third electrode) can be defined simply through filling in the area opened above the middle electrode with metal and planarizing back to the surface of the dielectric above the metal gate. Thus, a final electrode may have a profile of a plug instead of a step with horizontal shelf and vertical component. FIG. 12 shows an example structure resulting from this process according to disclosed embodiments. As seen, structure 1200 includes an electrode plug 1211 isolated from middle electrode 1113 and lower electrode 915 by dielectric structure 1201.

Thus, the middle or second electrode 1113 is electrically and physically separated from the bottom electrode 915 and top electrode 1211, and each S/D electrode can connect to MOL and BEOL metal layers through the formed "contact-up" structures that are embedded within the electrode structure. This provides a mechanism for each nanowire to be connected to any terminal of the device, even though all nanowires are physically positioned on top of one another (aligned vertically). The access to each wire is therefore done independently through what can be described as a stair-cased S/D bar/region or step-shaped stack of pieced-together electrodes. For this example, only three lateral nanowires were stacked overtop one another. For connecting to more nanowires, or rather nanowire layers, this process is repeated for as many stacked wires that exist in a given design. Once the final electrode needs to be formed, it is sufficient to fill the S/D bar with metal to complete the S/D bar electrodes.

The size of the selectively deposited dielectric film 1003 and 1115 over the S/D metal can be tuned in order to provide some etch selectivity that enables self-alignment when contacts are made to individual channels with the S/D bar electrodes as shown in FIG. 12.

Techniques herein thus can be used to form the MOL and BEOL metallization layers and transfers to within the S/D region/bar in the front-end-of-line (FEOL) where there is ample room to accommodate the congestion. Having the electrodes stack over-top of one another in a stair-case fashion provides a configuration that enables true 3D logic devices and complementary FET 3D logic where NFET and PFET wires are stacked over-top of one another in order to realize significant area scaling benefit of such devices as they allow stacking of devices overtop of one another.

Thus, a cyclical process can be executed for three-dimensional device fabrication. In conventional cells, P-MOS and N-MOS regions take up a lot of substrate space being on different sides of a chip. With techniques herein, nanowires are essentially folded over top of each other. Instead of making a larger chip, the cell is grown upwardly making the chip taller. Thus techniques herein provide significant area scaling.

With growing a chip upwardly, there is a metallization challenge. Conventional suggestions are to access nanowires from the side of cells or chips, but this essentially grows a cell horizontally and loses the benefit of area scaling. With techniques herein, all of the initial metal contacts are formed within the S/D region and routed vertically. Some conventional NAND chips make use of a staircase contact configuration, but this is essentially a single staircase that extends horizontally for however many steps are formed, thus increasing a size of the chip. With techniques herein, however, staircase segments or step-shaped segments are formed on top of each other almost comparable to a tetris puzzle, so that initial metal routing is formed within a source-drain region of a cell, thereby realizing horizontal space savings.

Techniques herein can be useful for devices having two levels of nanowires, but techniques herein become significantly more beneficial when there are three or more levels/layers of nanowires to be connected. By executing several depositions, fully isotropic recess etches, and selective depositions, a step-shaped wiring configuration can be formed.

In some embodiments, adjacent cells can share connections. For example, power and drain contacts can be shared, and then the individual bits to each cell are still independent metal lines. Such a technique provides further scaling benefits because not as many metal lines are needed. For some types of devices, such as SRAM, sharing connections is very beneficial. By being able to share contacts, cell size can be halved relative to a cell size needed for separate (non-shared) contacts. By folding regions over each other there can be a 50% reduction in chip size, and then by sharing contacts there can be another approximately 50% reduction. Thus, techniques herein can reduce chip size by 75% with the same device density. By way of an exemplary benefit, with techniques herein, 9 SRAM cells can fit within an area required by 4 DRAM cells.

Note also that techniques herein can be equally applied to gate configuration as well. Thus, a selective deposition processes within the gate can be executed also. The result is ability to form line contacts to adjacent or individual bit lines.

In the claims below, any of the dependents limitations can depend from any of the independent claims.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding.

Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A three dimensional (3-D) integrated circuit (IC) comprising:
   a substrate having a substrate surface;
   a first semiconductor device comprising a first electrical contact and being formed in a first area of said surface on a first plane substantially parallel to said substrate surface;
   a second semiconductor device comprising a second electrical contact and being formed in a second area of said surface on a second plane substantially parallel to said substrate surface and vertically spaced from said first plane in a direction substantially perpendicular to said substrate surface; and
   a first electrode structure comprising:
      opposing top and bottom surfaces substantially parallel to said substrate surface,
      a sidewall connecting the top and bottom surfaces such that the electrode structure forms a three dimensional electrode space,
      conductive fill material provided in said electrode space,
      a dielectric layer electrically separating the conductive fill material into a first electrode electrically connected to said first contact of said first semiconductor device and a second electrode electrically connected to said second semiconductor device and electrically insulated from said first electrode; and
      a first circuit terminal extending vertically from said top or bottom surface of said electrode structure and being electrically connected to said first electrode,
   wherein the first and second semiconductor devices comprise a first field effect transistor (FET) and a second FET respectively, the 3-D IC further comprising a third FET having a third electrical contact and being formed in a third area of said surface on a third plane substantially parallel to said substrate surface and vertically spaced from said first and second planes, and
   said first electrode structure further comprising another dielectric layer electrically separating the conductive fill material into a third electrode electrically connected to said third electrical contact of said third FET and electrically insulated from said first and second electrodes.

2. The 3-D IC of claim 1, wherein each FET comprises a gate region extending in a direction along the substrate surface, and a pair source-drain regions provided at opposite ends of the gate region, the gate regions and source-drain regions of respective FETs being vertically aligned with one another to form a first stacked FET structure.

3. The 3-D IC of claim 2, wherein:
   said 3-D IC further comprises a second and a third circuit terminal each extending vertically from said top or bottom surface of said electrode structure and being electrically connected to said second and third electrodes respectively.

4. The 3-D IC of claim 3, further comprising:
   a second stacked FET structure comprising fourth, fifth and sixth FETs configured identically to the first, second and third FETs of said first stacked FET structure; and
   a second electrode structure comprising fourth, fifth and sixth electrodes configured identically to the first, second and third electrodes of the first electrode structure and coupled to the second stacked FET structure, wherein said first and second stacked FET structures are electrically connected through said first and second electrode structures to form a six transistor SRAM memory cell.

5. The 3-D IC of claim 4,
   wherein said first, second and third terminals of the first electrode structure provide a VDD power terminal, a VSS power terminal and a bit terminal for the SRAM cell respectively, and
   at least one terminal of the second electrode structure provides a bit terminal for the SRAM cell.

6. The 3-D IC of claim 3, further comprising:
   a second stacked FET structure comprising fourth, fifth and sixth FETs configured identically to the first, second and third FETs of said first stacked FET structure; and
   a second electrode structure comprising fourth, fifth and sixth electrodes configured identically to the first, second and third electrodes of the first electrode structure and coupled to the second stacked FET structure, wherein said first and second stacked FET structures are positioned adjacently on said substrate and form portions of different SRAM cells.

7. The 3-D IC of claim 5, wherein each of the FETs is either a finFET, a multigate FET or a single nanowire FET.

8. The 3-D IC of claim 6, wherein each of the FETs is a single nanowire FET.

9. A semiconductor device comprising:
   a first layer of nanowires;
   a second layer of nanowires positioned above the first layer of nanowires;
   a third layer of nanowires positioned above the second layer of nanowires, wherein the first layer of nanowires, the second layer of nanowires, and the third layer of nanowires include nanowire portions positioned within a source-drain region of a semiconductor device;

a first electrode that connects the first layer of nanowires and is routed through the source-drain region to a first position above the source-drain region;

a second electrode that connects the second layer of nanowires and is routed through the source-drain region to a second position above the source-drain region;

a third electrode that connects the third layer of nanowires and is routed through the source-drain region to a third position above the source-drain region;

wherein a first contact structure is step-shaped with a portion of a second contact structure positioned above a horizontal surface of the underlying electrode structure.

10. The semiconductor device of claim 9, wherein the nanowires include complimentary semiconductor material above each other.

11. The semiconductor device of claim 9, wherein the step-shaped contact structure is positioned within the source-drain region and configured to electrically couple each layer of nanowires to a position above the source-drain region.

12. The semiconductor device of claim 9, wherein the first, second and third layers of nanowires comprise a first field effect transistor (FET), a second FET and a third FET respectively, the third FET being formed on a third plane substantially parallel to the second and first layers, and being vertically spaced from the first and second layers.

13. The semiconductor device according to claim 9, wherein the first electrode is separated from the second electrode by a dielectric film.

14. The semiconductor device according to claim 9, wherein the second electrode is separated from the third electrode by a dielectric film.

15. The semiconductor device according to claim 9, wherein the first layer of nanowires comprises P-type Field Effect Transistor (PFET) wires.

16. The semiconductor device according to claim 9, wherein the first layer of nanowires comprises N-type Field Effect Transistor (NFET) wires.

17. The semiconductor device according to claim 9, wherein the first layer of nanowires comprises nanowires of a different channel configuration than the nanowires of the second layer.

18. The semiconductor device according to claim 9, wherein the nanowires are silicon-germanium (SiGe) nanowires.

* * * * *

UNITED STATES PATENT AND TRADEMARK OFFICE
CERTIFICATE OF CORRECTION

PATENT NO. : 10,453,850 B2
APPLICATION NO. : 15/654327
DATED : October 22, 2019
INVENTOR(S) : Jeffrey Smith et al.

Page 1 of 1

It is certified that error appears in the above-identified patent and that said Letters Patent is hereby corrected as shown below:

In the Specification

In Column 2, Line 20, delete "a" and insert -- A --; (Second Occurrence)

In Column 2, Line 37, delete "versa" and insert -- versa. --;

In Column 2, Line 45, delete "a" and insert -- A --;

In Column 3, Line 2, delete "the" and insert -- The --;

In Column 3, Line 18, delete "that that" and insert -- that --;

In Column 8, Line 26, delete "PEFT" and insert -- PFET --; and

In Column 12, Line 35, delete "(which" and insert -- which --.

Signed and Sealed this
Seventh Day of April, 2020

Andrei Iancu
*Director of the United States Patent and Trademark Office*